United States Patent [19]

Hiday et al.

[11] Patent Number: 4,567,523
[45] Date of Patent: Jan. 28, 1986

[54] TELEVISION RECEIVER INPUT CIRCUIT

[75] Inventors: David R. Hiday, Dandridge; Charles G. Larsen, Knoxville, both of Tenn.

[73] Assignee: North American Philips Consumer Electronics Corp., New York, N.Y.

[21] Appl. No.: 558,226

[22] Filed: Dec. 5, 1983

[51] Int. Cl.[4] .................. H04N 5/44; H03H 7/38
[52] U.S. Cl. .................... 358/191.1; 333/129
[58] Field of Search ............ 358/191.1; 333/129, 333/132; 455/188

[56] References Cited

U.S. PATENT DOCUMENTS 3,611,198 10/1971 Ma ............................ 333/132

Primary Examiner—Michael A. Masinick
Assistant Examiner—Howard L. Carter
Attorney, Agent, or Firm—Thomas A. Briody; William J. Streeter; Marianne Rich

[57] ABSTRACT

A television receiver of the type capable of displaying standard VHF and UHF televison signals is provided with a single coaxial antenna input terminal. A passive input circuit within the receiver includes two filter sections for separating the VHF and UHF components of a combined VHF-UHF signal applied to the input terminal for application to separate VHF and UHF tuning sections of the receiver. The first filter section, which is located within the UHF tuning section, includes a UHF tuning line for coupling the UHF component to the UHF tuning section. The second filter section, which is located in the VHF filter section, and incorporates elements of the first filter section, enhances the response of the receiver over transition frequencies between the VHF and UHF bands.

10 Claims, 5 Drawing Figures

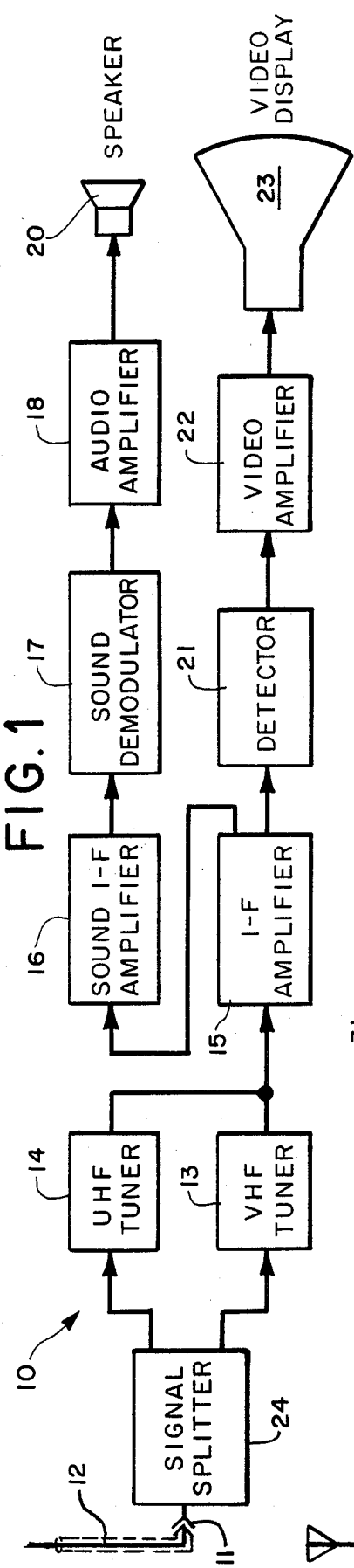

TELEVISION RECEIVER INPUT CIRCUIT

BACKGROUND OF THE INVENTION

The present invention relates generally to television receivers, and in particular to input circuits for television receivers for separating combined VHF and UHF signals applied to a common input.

In the United States television broadcast stations operate on assigned VHF and UHF frequencies in the range of 50 to 806 MHz. Cable television (CATV) systems, including those now in operation and those proposed for the future, operate within a frequency range which extends between 54 MHz and 806 MHz, excluding only the FM broadcast band (88-108 MHz). Because of the large range of frequencies encountered the usual practice has been to equip television receivers with separate VHF and UHF tuner sections, each designed for optimum performance over its intended frequency range.

In television receivers equipped with separate UHF and VHF tuner sections, it is necessary to apply received UHF television signals to the input of the UHF tuner section, and received VHF signals to the input of the VHF tuner section. For best performance, it is also desirable that the received VHF signals not be applied to the UHF tuner section, and similarly, that the received UHF signals not be applied to the VHF tuner section. In early UHF television broadcasting, a common practice was to employ separate VHF and UHF receiving antennas, each independently connected to the input terminals of respective tuner sections by means of separate transmission lines. Typically, balanced "twin-lead" transmission lines, consisting of two parallel spaced conductors, were used to make such connections.

More recently, television antennas have been developed which include VHF and UHF receiving elements assembled in a single unit. With such antennas, either a single balanced "twin-lead" transmission line having a low-loss dielectric suitable for the VHF and UHF bands, or a single unbalanced coaxial cable, can be used to interconnect the antenna with the television receiver. Coaxial cables are often preferred for their ease of installation, since they can be routed near metallic objects, such as a building plumbing system, with no adverse effect on their signal carrying ability. This is particularly attractive in large apartment or condominium complexes where a common antenna frequently provides television signals to a number of receivers.

Coaxial cable is also the preformed medium for transmitting cable television signals. Accordingly, television receivers intended for receiving CATV as well as broadcast television signals preferably allow direct connection of coaxial cable to the receiver unit.

In using a receiver having separate VHF and UHF inputs to display either broadcast or CATV signals, it is desirable to provide a circuit which separates or "splits" the composite VHF/UHF antenna signal on the twin-lead or coaxial cable into separate isolated VHF and UHF signal components for application to the inputs of the respective tuning sections. Typically, such splitter circuits have been provided as a separate component externally mounted to the television receiver housing adjacent the VHF and UHF input terminals.

The use of externally mounted splitting and matching circuits is in many instances inconvenient and complicates the installation of the television receiver and antenna system. Accordingly, a need has existed for an internal splitter/matching input circuit which provides good isolation between the VHF and UHF components and a single input terminal to which a single VHF-UHF coaxial transmission line can be attached. With such an arrangement, a coaxial line, carrying either a composite VHF/UHF antenna signal or a CATV signal, can be connected directly to a single coaxial connector located on the rear panel of the television receiver. Such an installation is neat, convenient and uncomplicated.

Since CATV operation has been proposed and authorized in the 216-470 MHz band, it is no longer acceptable to allow the VHF section of a signal splitter to begin attenuating signals above 216 MHz, the upper limit of the VHF broadcast band. Splitters compatible with cable systems preferably must allow signals up to 470 MHz to pass to the VHF tuner section substantially unattenuated, while providing sharp attenuation of frequencies above that limit. Accordingly, such compatibility with cable systems should be considered in designing a signal splitting circuit for use with modern television receivers.

In one previous single input connector arrangement, electronic switches were provided for connecting a single antenna input to the inputs of either the VHF or UHF tuners in accordance with electronic control signals provided from the television receiver's main tuning control. While the system performed effectively, the use of active elements in the circuit increased the relative expense of the television set as well as the possibility of circuit failure. The present application is directed to an improved input circuit which does not require active components, and which is less expensive to manufacture.

SUMMARY OF THE INVENTION

In a television receiver of the type having a VHF tuner section, a UHF tuner section and a single receiver input terminal, a passive input circuit is provided for separating the VHF and UHF components of a signal applied to the input terminal and for applying the VHF and UHF components to the inputs of the respective VHF and UHF tuner circuits. The input circuit includes a UHF tuning circuit or line and a first inductor having one end electrically connected to the input terminal. The first inductor is disposed adjacent the UHF tuning line so that the UHF tuning line is in electromagnetic communication with the first inductor. A first capacitor is electrically connected between the remaining terminal of the first inductor, forming together with the first inductor coupling means for electromagnetically coupling the UHF component of the applied signal to the UHF tuning line. A second inductor is electrically connected at its first end to the remaining end of the first inductor and is connected at its remaining end to the input of the VHF tuner circuit. A third inductor and a second capacitor are serially connected between the remaining end of the second inductor and ground. The first inductor, first capacitor and second inductor together form a first low pass filter section, and the second inductor, third inductor and second capacitor together form a second low-pass filter section. VHF signals applied to the input terminal pass to the input of the VHF tuner circuit, while UHF signals applied to the input are substantially attenuated at the input of the VHF tuner circuit.

BRIEF DESCRIPTION OF THE DRAWINGS

Features of the present invention which are believed to be novel are set forth with particularity in the appended claims. The invention, together with the further advantages thereof, can be understood by reference to the following description taken in conjunction with the accompanying drawings and the several figures, in which like reference numerals identify like elements, and of which:

FIG. 1 is a functional block diagram of a television receiver incorporating an input circuit constructed in accordance with the invention disclosed herein;

FIG. 2 is a simplified electrical schematic diagram of the input circuit of the television receiver shown in FIG. 1;

DESCRIPTION OF THE PREFERRED EMBODIMENT

Figure 3:
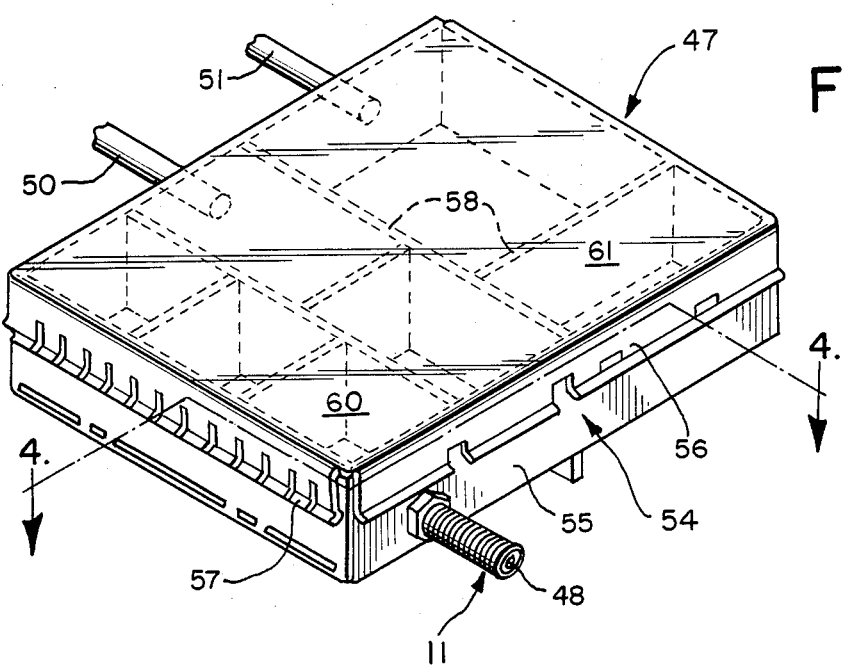
FIG. 3 is a perspective view of the tuner section of the television receiver and including an input circuit constructed in accordance with the invention.

Referring to the Figures, and in particular to FIG. 1, a television receiver 10 incorporating a passive single-input television receiver input circuit constructed in accordance with the invention is illustrated in functional block diagram form. Standard NTSB television VHF signals in the range of 54–216 MHz and UHF signals in the range of 470–806 MHz intercepted by a receiving antenna (not shown) or CATV signals supplied from a CATV system are applied to the input terminal 11 of the television receiver by means of transmission line 12, which is preferably of conventional coaxial configuration with a characteristic impedance of seventy-five ohms.

In accordance with conventional practice, the television receiver 10 includes separate VHF and UHF tuner sections 13 and 14 for selecting and processing the desired television signals in response to user manipulation of a channel select control. The tuners each convert signals applied to their inputs to a predetermined common intermediate frequency. Typically, each tuner section includes a tunable local oscillator for producing a signal which, when combined in suitable mixer circuitry with a desired television signal, produces a replica of the desired received signal at the predetermined intermediate frequency. By varying the frequency of the local oscillator, the television signal appearing at the IF output of the tuner can be selected.

The IF signals from either the VHF or UHF tuner sections are next applied to one or more IF amplifiers 15. In standard NTSB television signals the audio portion of the television program is transmitted on a frequency modulated carrier 4.5 MHz. higher than the video carrier frequency. Accordingly, IF amplifier stage 15 typically includes filter circuitry for separating the sound and picture IF signals.

The sound IF signal is applied to one or more sound IF amplifier stages 16. Suitable sound demodulator circuitry 17 demodulates the frequency modulated sound IF signal to produce an audio signal which is then applied to audio amplifier 18. The amplified audio signal is applied to speaker 20 to produce the audio portion of the television program.

After amplification by IF amplifier stage 15, the amplitude modulated video IF signal is applied to a video detector 21 wherein it is demodulated. The demodulated video signal is amplified by means of video amplifier 22, and is then applied to picture tube 23 to produce the video portion of the television program.

For the television receiver to deliver optimum performance, it is desirable that only UHF signals be applied to the UHF tuner, and similarly, that only VHF signals be applied to the VHF tuner. Accordingly, the television receiver includes signal splitting circuitry for separating the VHF and UHF components of the composite VHF/UHF/CATV signal provided by the antenna. In accordance with the invention, a single-input input circuit 24 is integrally included within the television receiver. As shown, input circuit 24 includes a single input 11 for receiving the composite VHF/UHF/CATV signals supplied by transmission line 12. The input circuit serves to separate the VHF, UHF and CATV components of the applied signal and applies each to its respective tuner. Additionally, the input circuit 24 attenuates local oscillator signals leaking through the inputs of the VHF and UHF tuner circuits to prevent their being radiated by the receiving antenna.

FIG. 2 is a partial schematic diagram showing the input circuit together with the input stages of the VHF and UHF tuners 13 and 14. The input circuit 24 includes two cascaded low-pass filter sections 26 and 27 serially connected between single-input terminal 25 and the input of the VHF tuner. Low pass filter section 26 is of the type commonly known as a constant-k "T" filter section and is characterized in that applied signals above a pre-selected cutoff frequency are substantially attenuated. Filter section 27 is of the type generally known as m-derived and is characterized in that it provides a relatively sharp characteristic output curve above the pre-selected cutoff frequency.

Referring still to FIG. 2, constant-k filter section 26 includes a first inductor 28 having one terminal connected to input terminal 25. The remaining terminal of the first inductor is connected to a terminal of a second inductor 40, and to a terminal of a first capacitor 30, the remaining terminal of which is connected to ground. Together, first inductor 28 and first capacitor 30 form coupling means for electromagnetically coupling the UHF components of the applied antenna signal to UHF tuner section input means. Such input means are preferably provided in the form of a UHF tuning line 31, the construction of which is well known in the art. In one typical construction, the UHF tuning line includes an inductor 32 having at least one end connected with one terminal of at least one tuning varactor. Generally, the UHF tuning line inductor is positioned adjacent the first inductor 28 of the coupling means in order to establish electromagnetic communication of the coupling means with the UHF tuning line 31.

In the embodiment described herein, the UHF tuning line inductor 32 comprises a ribbon conductor in the shape of 3 legs of a rectangle, disposed adjacent to, and parallel with the windings of inductor 28. In operation, inductor 28 and first capacitor 30 provide a low impedance path to ground for UHF signals applied at input 25. UHF signals applied at the input will therefore be induced in UHF tuning line 31 which is electrically connected with the UHF tuner circuit. As illustrated, the UHF tuning circuit 14 includes a pair of varactors 33 and 34 which, together with inductor 32, form a tuned circuit at UHF frequencies. A fixed capacitor 35 provides DC isolation between the varactors, while a variable trimmer capacitor 36 allows the UHF tuning circuit to be adjusted for optimum performance over the UHF range. The UHF tuning circuit is tuned by means of DC tuning voltages applied to varactors 33 and 34 by means of resistors 37 and 38. Capacitor 39 couples the UHF signal to the remainder of the UHF tuner circuitry. The application of a DC tuning voltage changes the capacitance of the varactors which in turn alters the resonant frequency of the UHF tuner circuit. Such an arrangement avoids the difficulties associated with mechanically altering the values of capacitors or inductors in order to change the resonant frequency of a tuned circuit, and has the further advantage that the DC tuning voltages may be digitally produced to allow digital tuning of the television receiver.

Referring still to FIG. 2, the low pass m-derived filter section 27 includes the second inductor 40 having a first end electrically connected to the juncture of the first inductor 28 and the first capacitor 30, and further includes a third inductor 41 and second capacitor 42 serially connected between the remaining terminal of the second inductor and ground. Second inductor 40 may be thought of as the series combination of an output inductor for constant-k filter 26 and an input inductor for m-derived section 27. Accordingly, its value will be the sum of the values of those elements had they been provided as separate discrete components. A resistor 43 of relatively large resistance, also connected at the juncture of the first inductor and first capacitor, prevents the slow accumulation of charge by the first capacitor. The VHF signals are decoupled at the juncture of the second and third inductors and are applied to the input of the VHF tuning circuit 13. An FM trap 44, comprising the parallel combination of capacitor 45 and inductor 46 provided in the VHF tuner circuit input, helps attenuates FM broadcast signals which might pass through the splitter. Component valves are chosen so that the cut-off frequency of the m-derived filter section 27 is above the upper frequency of both the VHF broadcast and CATV television bands. Preferably, a cut-off frequency of 400 MHz is chosen.

Figure 4:
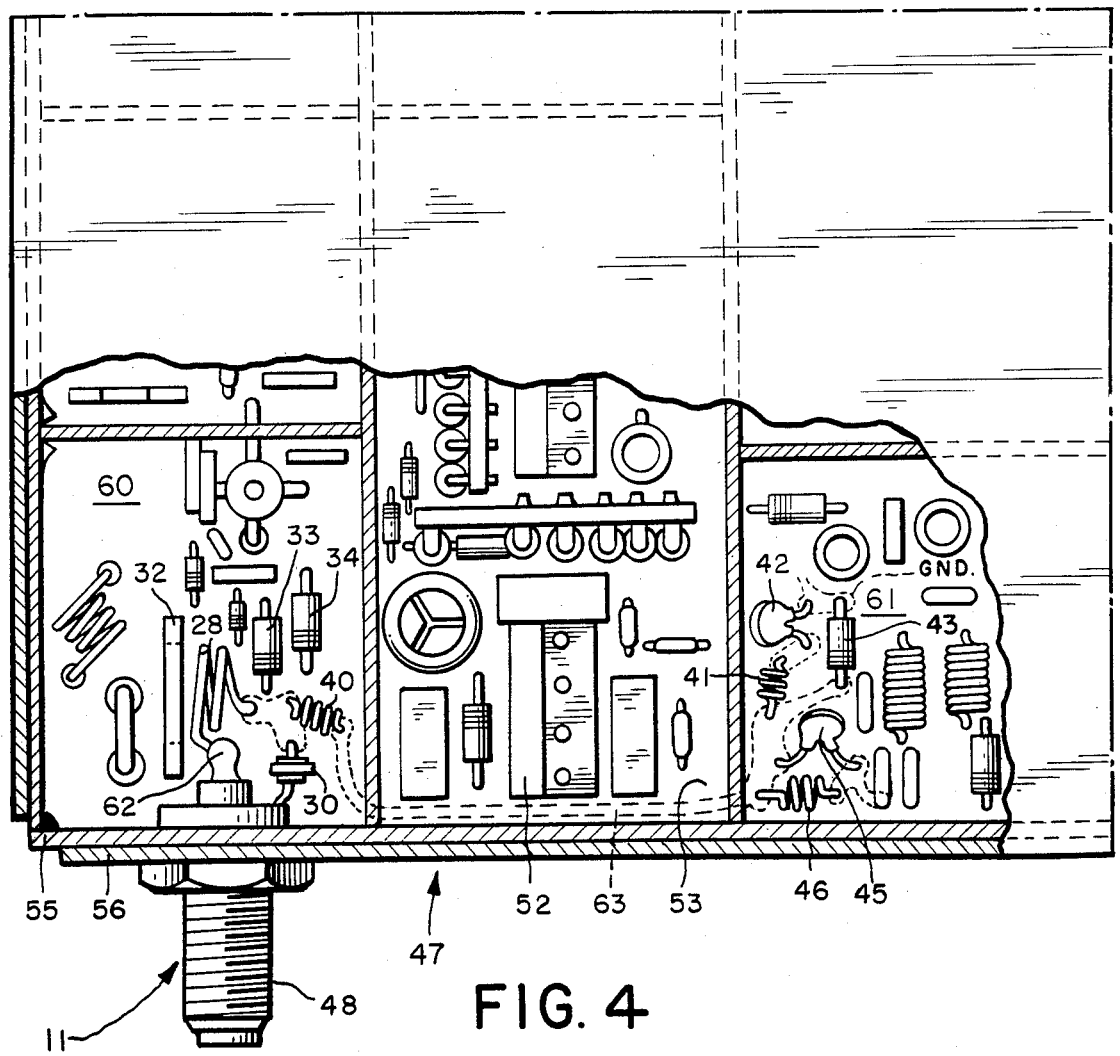
FIG. 4 is a fragmentary plan view, partially in section, of the tuner section shown in FIG. 3 taken along line 4—4 thereof.

FIGS. 3 and 4 show one commercial embodiment of a VHF/UHF tuner subassembly incorporating an input circuit constructed in accordance with the invention. The tuner subassembly 47 receives a composite VHF/UHF/CATV television signal applied at input 11 which comprises a coaxial RF connector 48 of known construction and provides selected IF and Prescaler outputs 50 and 51 corresponding to UHF and VHF television signals tuned in accordance with DC tuning voltages supplied to the tuner by means of electrical connector 52 (FIG. 4) in response to a user-selected setting of the television receiver main tuning control. In accordance with conventional practice, the tuner circuit components are mounted on a conventional printed circuit board 53 contained within a generally rectangular housing 54. The housing is fashioned from stamped sheet metal or the like and includes a main chassis 55 and a top cover 56. A plurality of tabs 57, formed along the edge of top cover 56, are inwardly biased so as to allow a tight spring-fit of the cover to the main chassis. A plurality of internal baffles 58 compartmentalize the interior of the housing to minimize RF coupling of the tuner subcircuits and to provide additional mechanical rigidity to the tuner subassembly. As shown, compartment 60 contains the UHF antenna tuning circuitry while the VHF antenna tuning circuitry is housed within compartment 61.

FIG. 4 shows in greater detail the portion of the tuner subassembly in which the invention is embodied. The center conductor 62 of RF connector 48 is directly connected to one end of first inductor 28 which, in the embodiment shown, comprises one and one half turns of enameled wire forming a loop extending generally perpendicular to the surface of circuit board 53. UHF tuning line inductor 32 comprises a section of flat metallic ribbon in the general form of 3 legs of a rectangle projecting perpendicularly from the upper surface of circuit board 53 and extending generally adjacent to and parallel with inductor 28 and serves to couple the UHF components of the signal applied to connector 48. Capacitor 30 is connected between the distal end of first inductor 28 and circuit ground while inductor 40 is connected between the same end of inductor 28 and a circuit conductor 63. Circuit conductor 63 provides an inductance, shown in phantom in FIG. 2, which shown forms part of the inductance 40 included in the m-derived section. Additional components of the UHF tuning circuit, such as tuning varactors 33 and 34, are also contained within compartment 60.

In the embodiment shown, the RF input connector 48 physically extends into UHF tuning compartment 60 located toward the left of the tuner subassembly 47. Since VHF tuning compartment 61 is located to the right, printed circuit conductor 63 extends between the two compartments. It is a feature of the input circuit that by initially decoupling the UHF component of the composite signal applied to RF connector 48, the remaining VHF component may be transferred to other physical locations of circuit board 53 without causing excessive leakage of UHF energy into the adjacent circuitry. Within compartment 61 inductor 41 and capacitor 42 are serially connected between conductor 63 and circuit ground 49, while inductor 46 and capacitor 45 interconnect the conductor with the remainder of the VHF tuning section.

In the commercial embodiment of the VHF/UHF tuner sub-assembly shown in FIGS. 3 and 4, the first and second inductors 28 and 40 had inductances of 29.8 microhenries and 47.8 microhenries, respectively, while the third inductor 41 had an inductance of approximately 32 microhenries. In the same embodiment, the first capacitor 30 had a capacitance of approximately 10.6 picofarads while the second capacitor 42 had a capacitance of approximately 3.2 picofarads. These component values gave a circuit input impedance of seventy-five ohms to match that of the antenna system and a VHF/UHF cut-off frequency of 400 MHz.

Figure 5:
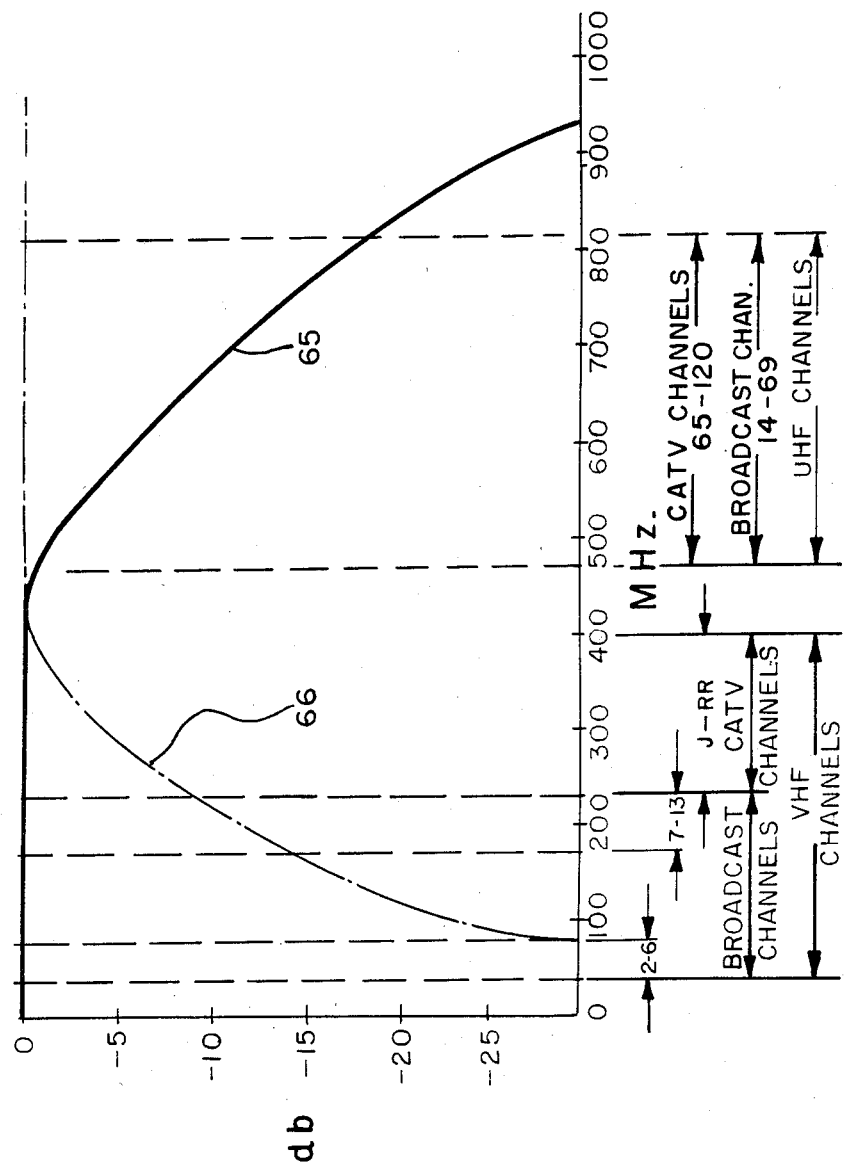
FIG. 5 is a graphical depiction of certain passband characteristics showing the VHF and UHF output responses of the input circuit.

The frequency response of an input circuit having the component values selected to provide a 470 MHz cutoff is illustrated in FIG. 5. Referring to that Figure, the output response of the UHF coupling circuit measured at the UHF tuning line is depicted by the broken-line curve 66. Using the output response at 400 MHz to be the 0 db. reference, the output of the UHF tuning circuit is seen to be approximately −4 db. at 300 MHz, −10 db. at 200 MHz, −18 db. at 100 MHz and −25 db. at 75 MHz. The response of the input circuit taken at the VHF output formed a the juncture of the second and third inductors is shown by the solid line 65 of FIG. 5. Again taking the response at 400 MHz as the 0 db. reference, the output signal is seen to be −5 db. at 500 MHz, −8 db. at 600 MHz, −12 db. at 700 MHz and −19 db. at 800 MHz. By reference to curve 65 of FIG. 5, it will be observed that substantially no attenuation takes place at 400 MHz, the upper frequency limit of the VHF television band.

While particular component values have been shown for purposes of illustrating one successful embodiment of the invention, it will be apparent to those skilled in the art that component values other than those shown may be substituted without substantially altering the performance of the input circuit.

While particular embodiments of the invention have been shown and described, it will be obvious to those skilled in the art that changes and modifications may be made therein without departing from the invention in its broader aspects, and therefore, the aim in the appended claims is to cover all such changes and modifications as fall within the true spirit and scope the invention.

We claim:

1. In a television receiver receiving combined VHF and UHF signals at a receiver input terminal, said receiver having VHF tuner means having a VHF input and UHF tuner means having a UHF input:
   an input circuit for separating said VHF and UHF signals and for applying the so-separated VHF and UHF signals to said inputs of said VHF and UHF tuner means, respectively, comprising:
   first coupling means for coupling electromagnetic energy to said UHF tuner means, said first coupling means comprising a first inductor having a first end electrically connected to said receiver input terminal and a second end, a first capacitor electrically connected to said second terminal of said first inductor, and UHF tuning inductor means disposed adjacent said first inductor so that said UHF tuning inductor means is in electromagnetic communication with said first inductor;
   a second inductor having a first end electrically connected to said second end of said first inductor and a second end electrically connected to said VHF input; and
   a third inductor and a second capacitor serially connected between said second end of said second inductor and reference potential, said first inductor, said first capacitor and said second inductor together forming a low pass filter section, and said second inductor, said third inductor and said second capacitor together forming an additional low pass filter section, whereby VHF signals applied to said receiver input terminal pass to said VHF tuner input, and UHF signals applied to said receiver input terminal pass to said UHF input, said UHF signals being substantially attenuated at said VHF input.

2. An input circuit as defined in claim 1 wherein said first inductor, said first capacitor and said second inductor form a low-pass constant-k filter section for substantially attenuating signals above 500 MHz.

3. An input circuit as defined in claim 2 wherein said second inductor, said third inductor and said second capacitor together form a low-pass m-derived terminating half section for substantially attentuating frequencies above 500 MHz.

4. An input circuit as defined in claim 3, wherein said UHF tuner means comprises at least one tuning varactor, and means for coupling said UHF tuning inductor means to said varactor.

5. An input circuit as defined in claim 3, wherein the input impedance at said receiver input terminal is seventy-five ohms.

6. An input circuit as defined in claim 5, wherein said first inductors has an inductance of approximately 29,8 microhenries, said second induction has an inductance of 47.8 microhenries, said third inductor has an inductance of approximately 32 microhenries, said first capacitor has a capacitance of approximately 10.6 picofarads and said second capacitor has a capacitance of approximately 32 picofarads.

7. An input circuit for use in a television receiver of the type having a VHF tuner section, a UHF tuner section and a single receiver input terminal, for separating the VHF and UHF components of a combined VHF-UHF signal applied to said receiver input terminal and for applying the VHF and UHF components to the VHF and UHF input of respective VHF and UHF tuner circuits, comprising:
   a constant-k low-pass filter section having an input electrically connected to said receiver input terminal and including at least one inductor element;
   means for electromagnetically coupling said at least one inductor element to said UHF input of said UHF tuner circuit; and
   a low pass m-derived filter section having its input electrically connected to the output of said constant-k filter section and having its output connected to said VHF input of said VHF tuner circuit.

8. An input circuit as defined in claim 7 wherein said means for electromagnetically coupling said at least one inductor element to said UHF input of said UHF tuner circuit comprises a UHF tuning inductor means.

9. An input circuit as defined in claim 8 wherein said receiver input terminal is a coaxial input terminal, wherein said constant-k filter section comprises a first inductor having one end connected to said coaxial input terminal, a second inductor having one end connected to the remaining end of said first inductor and a first capacitor connected between the juncture of said remaining end of said first inductor and said end of said second inductor and ground.

10. An input circuit as defined in claim 9 wherein said low pass m-derived filter section further comprises, a third inductor and a second capacitor serially connected between the remaining terminal of said second inductor and ground.

* * * * *